United States Patent
Vanderberg et al.

(10) Patent No.: US 10,037,877 B1
(45) Date of Patent: Jul. 31, 2018

(54) ION IMPLANTATION SYSTEM HAVING BEAM ANGLE CONTROL IN DRIFT AND DECELERATION MODES

(71) Applicant: Axcelis Technologies, Inc., Beverly, MA (US)

(72) Inventors: Bo H. Vanderberg, Gloucester, MA (US); Edward C. Eisner, Lexington, MA (US)

(73) Assignee: Axcelis Technologies, Inc, Beverly, MA (US)

( * ) Notice: Subject to any disclaimer, the term of this patent is extended or adjusted under 35 U.S.C. 154(b) by 0 days.

(21) Appl. No.: 15/637,538

(22) Filed: Jun. 29, 2017

(51) Int. Cl.
| | | |
|---|---|---|
| *A61N 5/00* | (2006.01) | |
| *H01J 49/20* | (2006.01) | |
| *H01J 49/12* | (2006.01) | |
| *H01J 49/06* | (2006.01) | |

(52) U.S. Cl.
CPC ............ *H01J 49/20* (2013.01); *H01J 49/061* (2013.01); *H01J 49/126* (2013.01)

(58) Field of Classification Search
CPC .. H01J 49/00; H01J 49/02; H01J 49/20; H01J 49/06; H01J 49/061; H01J 49/126; H01J 37/00; H01J 37/02; H01J 37/023; H01J 37/04; H01J 37/36; H01J 37/317; H01J 37/3171; H01J 37/3172
USPC .... 250/281, 282, 298, 492.1, 492.2, 492.21, 250/492.22, 492.23
See application file for complete search history.

(56) References Cited

U.S. PATENT DOCUMENTS

| | | |
|---|---|---|
| 7,399,980 B2 | 7/2008 | Vanderberg et al. |
| 2008/0061228 A1 | 3/2008 | Vanderberg et al. |
| 2009/0108198 A1 | 4/2009 | Satoh et al. |
| 2009/0267001 A1* | 10/2009 | Huang .................. H01J 37/20 250/492.21 |
| 2015/0380206 A1 | 12/2015 | White et al. |

OTHER PUBLICATIONS

Non Final Office Action dated May 17, 2016 U.S. Appl. No. 14/979,653.
Final Office Action dated Sep. 20, 2016 U.S. Appl. No. 14/979,653.

* cited by examiner

*Primary Examiner* — Jason McCormack
(74) *Attorney, Agent, or Firm* — Eschweiler & Potashnik, LLC

(57) ABSTRACT

An ion implantation system has an ion source forming an ion beam. An mass analyzer defines and varies a mass analyzed beam along a beam path. A moveable mass resolving aperture assembly has a resolving aperture whose position is selectively varied in response to the variation of the beam path by the mass analyzer. A deflecting deceleration element positioned selectively deflects the beam path and selectively decelerate the mass analyzed beam. A controller selectively operates the ion implantation system in both a drift mode and decel mode. The controller passes the mass analyzed beam along a first path through the resolving aperture without deflection or deceleration in the drift mode and deflects and decelerates the beam along a second path in the decel mode. The position of the resolving aperture is selectively varied based on the variation in the beam path through the mass analyzer and the deflecting deceleration element.

20 Claims, 8 Drawing Sheets

ION IMPLANTATION SYSTEM HAVING BEAM ANGLE CONTROL IN DRIFT AND DECELERATION MODES

FIELD OF THE INVENTION

The present invention relates generally to ion implantation systems, and more specifically to systems and methods for performing beam angle adjustments of ion beams in ion implantation systems.

BACKGROUND OF THE INVENTION

In the manufacture of semiconductor devices, ion implantation is used to dope semiconductors with impurities or dopants. Ion beam implanters are used to treat silicon wafers with an ion beam, in order to produce n or p type extrinsic material doping or to form passivation layers during fabrication of an integrated circuit. When used for doping semiconductors, the ion beam implanter injects a selected extrinsic species to produce the desired semiconducting material. Implanting ions generated from source materials such as antimony, arsenic or phosphorus results in "n type" extrinsic material wafers, whereas if "p type" extrinsic material wafers are desired, ions generated with source materials such as boron, or indium may be implanted.

Typical ion beam implanters include an ion source for generating positively charged ions from ionizable source materials. The generated ions are formed into a beam and directed along a predetermined beam path to an implantation station. The ion beam implanter may include beam forming and shaping structures extending between the ion source and the implantation station. The beam forming and shaping structures maintain the ion beam and bound an elongated interior cavity or passageway through which the beam passes en route to the implantation station. When operating an implanter, this passageway can be evacuated to reduce the probability of ions being deflected from the predetermined beam path as a result of collisions with gas molecules.

Trajectories of charged particles of given kinetic energy in a magnetic field will differ for different masses (or charge-to-mass ratios) of these particles. Therefore, the part of an extracted ion beam which reaches a desired area of a semiconductor wafer or other target after passing through a constant magnetic field can be made pure since ions of undesirable molecular weight will be deflected to positions away from the beam and implantation of other than desired materials can be avoided. The process of selectively separating ions of desired and undesired charge-to-mass ratios is known as mass analysis. Mass analyzers typically employ a mass analysis magnet creating a dipole magnetic field to deflect various ions in an ion beam via magnetic deflection in an arcuate passageway which will effectively separate ions of different charge-to-mass ratios.

For some ion implantation systems, the physical size of the beam is smaller than a target workpiece, so the beam is scanned in one or more directions in order to adequately cover a surface of the target workpiece. Generally, an electrostatic or magnetic based scanner scans the ion beam in a fast direction and a mechanical device moves the target workpiece in a slow scan direction in order to provide sufficient cover.

Thereafter the ion beam is directed toward a target end station, which holds a target workpiece. Ions within the ion beam implant into the target workpiece, which is ion implantation. One important characteristic of ion implantation is that there exists a uniform angular distribution of ion flux across the surface of the target workpiece, such as a semiconductor wafer. The angular content of the ion beam defines implant properties through crystal channeling effects or shadowing effects under vertical structures, such as photoresist masks or CMOS transistor gates. A non-uniform angular distribution or angular content of the ion beam can lead to uncontrolled and/or undesired implant properties.

Angle correction is sometimes used when deflecting decel lenses are implemented in order to prevent the risk of energetic contamination. Energetic contamination can be considered the content of ions with a non-desired energy (typically higher than the desired energy), resulting in improper dopant placement in the workpiece, which can further cause undesired device performance or even device damage.

Beam diagnostic equipment can be employed to measure the angle content of ion beams. The measurement data can then be employed to adjust angle characteristics of the ion beam. However, conventional approaches can increase complexity of the ion implantation system and undesirably increase the length of path along which the ion beam travels.

SUMMARY OF THE INVENTION

The following presents a simplified summary of the invention in order to provide a basic understanding of some aspects of the invention. This summary is not an extensive overview of the invention, and is neither intended to identify key or critical elements of the invention nor to delineate the scope of the invention. Rather, the purpose of the summary is to present some concepts of the invention in a simplified form as a prelude to the more detailed description that is presented later.

Aspects of the invention facilitate ion implantation by performing angle adjustments without additional components being added to ion implantation systems. The aspects employ a mass analyzer to perform selected angle adjustments during ion implantation instead of employing separate and/or additional components.

In accordance with one exemplary aspect of the disclosure, an ion implantation system is provided, wherein an ion source configured to form an ion beam. A mass analyzer is provided and configured to selectively separate ions having a predetermined charge-to-mass ratio from the ion beam, therein defining a mass analyzed beam along a beam path. The mass analyzer is further configured to selectively vary the beam path.

According to one example, a moveable mass resolving aperture assembly is provided having a resolving aperture configured to permit selected species of the mass analyzed beam therethrough. The moveable mass resolving aperture assembly, for example, is configured to selectively vary a position of the resolving aperture in response to the selective variation of the beam path by the mass analyzer.

A deflecting deceleration element, for example, is further positioned downstream of the moveable mass resolving aperture assembly. The deflecting deceleration element, for example, is configured to selectively vary the beam path therethrough, wherein the deflecting deceleration element is further configured to selectively decelerate the mass analyzed beam.

According to the present disclosure, a controller is further provided and configured to control the ion source, mass analyzer, moveable mass resolving aperture assembly, and deflecting deceleration element to selectively operate the ion implantation system in a drift mode and a decel mode. In the drift mode, for example, the controller is configured to control the beam path so as to pass the mass analyzed beam along a first path through the resolving aperture without deflecting or decelerating the mass analyzed beam via the deflecting deceleration element. In the decel mode, the controller is configured to control the beam path so as to pass the mass analyzed beam along a second path passing through the resolving aperture, as well as to deflect and decelerate the mass analyzed beam along the second path via the deflecting deceleration element. The second path differs from the first path. Further, the selective variation of the position of the resolving aperture by the controller, for example, is based on the selective variation of the beam path through the mass analyzer and the deflecting deceleration element.

In another example, the ion implantation system further comprises an angle measurement system configured to determine a beam incidence angle proximate to the workpiece. The controller, for example, is further configured to alter a magnetic field associated with the mass analyzer based on the beam incidence angle, therein selectively varying the beam path. In another example, the controller is further configured to vary the position of the resolving aperture based on the beam incidence angle, therein selectively varying the beam path. The angle measurement system, for example, comprises a measurement cup configured to translate through the beam path and measure a plurality of beam incidence angles at a plurality of locations. Other systems and methods are also disclosed.

The above summary is merely intended to give a brief overview of some features of some embodiments of the present disclosure, and other embodiments may comprise additional and/or different features than the ones mentioned above. In particular, this summary is not to be construed to be limiting the scope of the present application. Thus, to the accomplishment of the foregoing and related ends, the disclosure comprises the features hereinafter described and particularly pointed out in the claims. The following description and the annexed drawings set forth in detail certain illustrative embodiments of the disclosure. These embodiments are indicative, however, of a few of the various ways in which the principles of the disclosure may be employed. Other objects, advantages and novel features of the disclosure will become apparent from the following detailed description of the disclosure when considered in conjunction with the drawings.

DETAILED DESCRIPTION OF THE INVENTION

Figure 1:
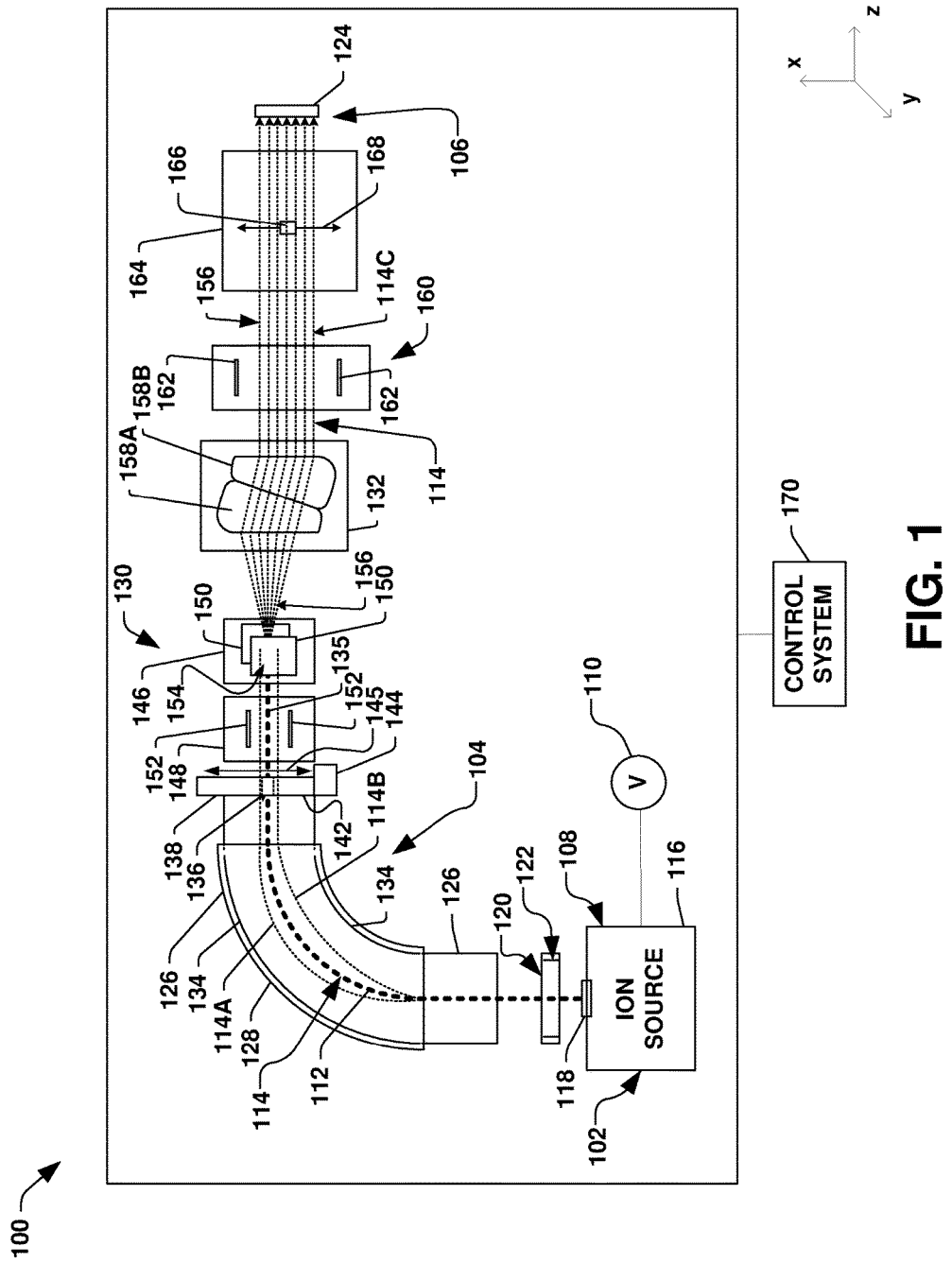
FIG. 1 illustrates an example ion implantation system in accordance with an aspect of the present invention.

The present disclosure provides for ion implantation employing a mass analyzer, a moveable mass resolving aperture, and a measurement system to perform angle correction/adjustment in addition to mass analysis via a controller. As a result, angle corrections of the implant angle can be performed without additional components along the beam line.

Accordingly, the present invention will now be described with reference to the drawings, wherein like reference numerals may be used to refer to like elements throughout. It is to be understood that the description of these aspects are merely illustrative and that they should not be interpreted in a limiting sense. In the following description, for purposes of explanation, numerous specific details are set forth in order to provide a thorough understanding of the present invention. It will be evident to one skilled in the art, however, that the present invention may be practiced without these specific details. Further, the scope of the invention is not intended to be limited by the embodiments or examples described hereinafter with reference to the accompanying drawings, but is intended to be only limited by the appended claims and equivalents thereof.

It is also noted that the drawings are provided to give an illustration of some aspects of embodiments of the present disclosure and therefore are to be regarded as schematic only. In particular, the elements shown in the drawings are not necessarily to scale with each other, and the placement of various elements in the drawings is chosen to provide a clear understanding of the respective embodiment and is not to be construed as necessarily being a representation of the actual relative locations of the various components in implementations according to an embodiment of the invention. Furthermore, the features of the various embodiments and examples described herein may be combined with each other unless specifically noted otherwise.

It is also to be understood that in the following description, any direct connection or coupling between functional blocks, devices, components, circuit elements or other physical or functional units shown in the drawings or described herein could also be implemented by an indirect connection or coupling. Furthermore, it is to be appreciated that functional blocks or units shown in the drawings may be implemented as separate features or circuits in one embodiment, and may also or alternatively be fully or partially implemented in a common feature or circuit in another embodiment. For example, several functional blocks may be implemented as software running on a common processor, such as a signal processor. It is further to be understood that any connection which is described as being wire-based in the following specification may also be implemented as a wireless communication, unless noted to the contrary.

FIG. 1 illustrates an example ion implantation system 100 in accordance with an aspect of the present invention. The ion implantation system 100 is presented for illustrative purposes and it is appreciated that aspects of the invention are not limited to the described ion implantation system and that other suitable ion implantation systems of varied configurations can also be employed.

The ion implantation system 100 has a terminal 102, a beamline assembly 104, and an end station 106. The terminal 102 includes an ion source 108 powered by a high voltage power supply 110 that produces and directs an ion beam 112 to the beamline assembly 104. The ion source 108 generates charged ions that are extracted and formed into the ion beam 112, which is directed along a beam path 114 in the beamline assembly 104 to the end station 106.

To generate the ions, a gas of a dopant material (not shown) to be ionized is located within a generation chamber 116 of the ion source 108. The dopant gas, for example, can be fed into the generation chamber 116 from a gas source (not shown). In addition to the high voltage power supply 110, it will be appreciated that any number of suitable mechanisms (not shown) can be used to excite free electrons within the ion generation chamber 116, such as RF or microwave excitation sources, electron beam injection sources, electromagnetic sources and/or a cathode which creates an arc discharge within the chamber, for example. The excited electrons collide with the dopant gas molecules and ions are generated thereby. Typically, positive ions are generated, although the disclosure herein is applicable to systems wherein negative ions are generated as well.

The ions are controllably extracted through an aperture 118 in the generation chamber 116 by an ion extraction assembly 120, in this example. The ion extraction assembly 120, for example, comprises a plurality of extraction and/or suppression electrodes 122. The extraction assembly 120, for example, can include a separate extraction power supply (not shown) to bias the extraction and/or suppression electrodes 122 to accelerate the ions from the generation chamber 116. It can be appreciated that since the ion beam 112 comprises like-charged particles, the ion beam may have a tendency to blow up or expand radially outwardly as the like charged particles repel one another. It can also be appreciated that ion beam blow-up can be exacerbated in low energy, high current (high perveance) beams where many like charged particles (e.g., high current) are moving in the same direction relatively slowly (e.g., low energy) such that there is an abundance of repulsive forces among the particles, but little particle momentum to keep the particles moving in the direction of the beam path. Accordingly, the extraction assembly 120 is generally configured so that the ion beam 112 is extracted at a high energy so that the ion beam does not blow up (e.g., so that the particles have sufficient momentum to overcome repulsive forces that can lead to beam blow up). Moreover, the ion beam 112, in this example, is generally transferred at a relatively high energy throughout the system and can be reduced just prior to a workpiece 124 being implanted to promote beam containment.

The beamline assembly 104, for example, comprises a beamguide 126, a mass analyzer 128, a scanning system 130, and a parallelizer 132. The scanning system 130 and parallelizer 132, for example, may be excluded or not activated when implanting utilizing a pencil or spot ion beam. The mass analyzer 128, for example, performs mass analysis and angle correction/adjustment on the ion beam 112. The mass analyzer 128, in this example, is formed at about a ninety degree angle and comprises one or more magnets (not shown) that serve to establish a (dipole) magnetic field therein. As the ion beam 112 enters the mass analyzer 128, it is correspondingly bent by the magnetic field such that ions of an inappropriate charge-to-mass ratio are rejected. More particularly, ions having too great or too small a charge-to-mass ratio are deflected into side walls 134 of the mass analyzer 128. In this manner, the mass analyzer 128 allows those species of ions in the ion beam 112 which have the desired charge-to-mass ratio to pass there-through to define a mass analyzed ion beam 135 and exit through a resolving aperture 136 of a moveable mass resolving aperture assembly 138.

The mass analyzer 128, for example, can perform angle corrections on the ion beam 112 by controlling or adjusting an amplitude of the magnetic dipole field. This adjustment of the magnetic field causes selected ions having the desired/selected charge-to-mass ratio to travel along a different or altered beam path (e.g., illustrated as beam paths 114A, 114B). As a result, the moveable mass resolving aperture assembly 138 can control and vary a position of the resolving aperture 136 according to the altered beam path 114A, 114B. In one example, the moveable mass resolving aperture assembly 138 comprises an aperture plate 142 that is movable about an x direction via an actuator 144 so as to accommodate the altered beam path 114A, 114B through the resolving aperture 136. The mass analyzer 128 and the moveable mass resolving aperture assembly 138 allow variations in the magnetic field and resulting altered beam path 114A, 114B while maintaining suitable mass resolution for the ion implantation system 100. Accordingly, the moveable mass resolving aperture assembly 138 of the present disclosure is configured to selectively vary a position (indicated by arrow 145) of the resolving aperture 136 in response to the selective variation of the beam path 114 by the mass analyzer 128.

It will be appreciated that ion beam collisions with other particles in the system 100 can degrade integrity of the ion beam 112. Accordingly, one or more pumps (not shown) may be included to evacuate, at least, the beamguide 126 and mass analyzer 128.

The scanning system 130, for example, comprises a magnetic scanning element 146 and a focusing and/or steering element 148. Respective power supplies (not shown) can be operatively coupled to the scanning element 146 and the focusing and steering element 148, and more particularly to respective electromagnet pieces 150 and electrodes 152 located therein. The focusing and steering element 148, for example, receives the mass analyzed ion beam 135 having a relatively narrow profile (e.g., a "pencil" beam in the illustrated ion implantation system 100). A voltage applied to the electrodes 152 operates to focus and steer the mass analyzed beam 135 to a scan vertex 154 of the scanning element 146. A voltage waveform applied to the electromagnets 150 then scans the mass analyzed beam back and forth, in this example, to define a scanned beam 156. It will be appreciated that the scan vertex 154 can be defined as the point in the optical path from which each beamlet or scanned part of the beam that appears to originate after having been scanned by the scanning element 146.

The scanned beam 156 is then passed through the parallelizer 132 (e.g., a parallelizer/corrector component), which comprises two dipole magnets 158A, 158B in the illustrated example. The dipole magnets 158A, 158B, for example, are substantially trapezoidal and are oriented to mirror one another to cause the scanned beam 156 to bend into a substantially S-shape. Stated another way, the dipole magnets 158A, 158B have equal angles and radii and opposite directions of curvature.

The parallelizer 132, for example, causes the scanned beam 156 to alter its beam path 114C such that the mass analyzed beam 135 travels parallel to a beam axis regardless of the scan angle. As a result, the implantation angle is relatively uniform across the workpiece 124. In one example, one or more of the parallelizers 132 also act as deflecting components, such that neutrals generated upstream of the parallelizers will not follow the nominal path, and thus have as smaller probability of reaching the end station 106 and the workpiece 124.

One or more deflecting deceleration elements 160 are located downstream of the parallelizer 132 in this example. Up to this point in the ion implantation system 100, the ion beam 112, 135 is generally transported at a relatively high energy level to mitigate the propensity for beam blow up, which can be particularly high where beam density is elevated, such as at the scan vertex 154. The one or more deflecting deceleration elements 160, for example, comprise one or more electrodes 162 operable to decelerate and/or deflect the mass analyzed beam 135.

It will be appreciated that the one or more deflecting deceleration elements 160 may comprise any suitable number of electrodes arranged and biased to accelerate and/or decelerate ions, as well as to focus, bend, deflect, converge, diverge, scan, parallelize and/or decontaminate the ion beam 112, 135, such as provided in U.S. Pat. No. 6,777,696 to Rathmell et al. the entirety of which is hereby incorporated herein by reference.

Additionally, the focusing and/or steering element 148 may comprise electrostatic deflection plates (e.g., one or more pairs of electrostatic deflection plates), as well as an Einzel lens, quadrupoles and/or other focusing elements to focus the ion beam. Together with the one or more deflecting deceleration elements 160, the parallelizer 132 thus also acts as a deflector to reduce energy contamination. It will be appreciated that additional deflecting filters in additional directions may also be implemented. For example, the one or more deflecting deceleration elements 160 in FIG. 1 deflects the mass analyzed beam 135 in the y-direction to increase the energy purity of the implant.

In accordance with one exemplary aspect of the disclosure, the deflecting deceleration element 160 is provided and configured to provide selectable deceleration of the mass analyzed beam 135 downstream of the mass analyzer 128 to selectively provide post decel and drift modes of operation of the ion implantation system. In post decel mode, for example, post decel electrodes 162 are provided to selectively decrease an energy of the mass analyzed beam 135 after the mass analyzer 128. In drift mode, for example, the energy of the mass analyzed beam 135 is not altered after the mass analyzer 128.

In accordance with various examples of the present disclosure, as stated above, the mass analyzer 128 is configured to selectively vary the beam path 114, whereby the moveable mass resolving aperture assembly 138 may translate the resolving aperture 136 in response to the selective variation of the beam path 114 by the mass analyzer 128. Furthermore, the deflecting deceleration element 160 that is positioned downstream of the moveable mass resolving aperture assembly 138 is configured to selectively vary the beam path 114 as the mass analyzed beam passes therethrough, as well as selectively decelerate the mass analyzed beam. It should be noted, however, that the deflecting deceleration element 160 may likewise be left non-energized, whereby the mass analyzed beam 135 passes therethrough without deflection or deceleration, such as when operating the ion implantation system in drift mode.

The end station 106 then receives the mass analyzed beam 135 which is directed toward the workpiece 124. It is appreciated that different types of end stations 106 may be employed in the ion implantation system 100. For example, a "batch" type end station can simultaneously support multiple workpieces 124 on a rotating support structure, wherein the workpieces are rotated through the path 114 of the ion beam 112, 135 until all the workpieces completely implanted. A "serial" type end station, on the other hand, supports a single workpiece 124 along the beam path 114 for implantation, wherein multiple workpieces are implanted one at a time in serial fashion, with each workpiece being completely implanted before implantation of the next workpiece begins. In hybrid systems the workpiece 124 may be mechanically translated in a first (Y or slow scan) direction while the beam is scanned in a second (X or fast scan) direction to impart the ion beam 112, 135 over the entire workpiece.

The end station 106 in the illustrated example of FIG. 1 is a "serial" type end station that supports the single workpiece along the beam path 114 for implantation. A dosimetry system 164 may be further included in the end station 106 near the location of the workpiece 124 for calibration measurements prior to implantation operations. During calibration, the ion beam 112, 135 passes through dosimetry system 164. The dosimetry system 164 includes one or more profilers 166 that may be stationary or continuously traverse a profiler path 168, thereby measuring the profile of the ion beam 112, 135 (e.g., scanned or un-scanned spot or pencil beam).

The one or more profilers 166, in this example, may comprise a current density sensor, such as a Faraday cup or measurement cup, that measures the current density of the scanned beam, where current density is a function of the angle of implantation (e.g., the relative orientation between the ion beam 112, 135 and the mechanical surface of the workpiece 124 and/or the relative orientation between the ion beam and the crystalline lattice structure of the workpiece). The one or more profilers 166 move in a generally orthogonal fashion relative to the scanned beam 156 and thus generally traverses the width of the ribbon beam. The dosimetry system 164, in one example, is configured to measure or otherwise determine both beam density distribution and angular distribution of the ion beam 112, 135.

According to the present disclosure, a controller 170 (also called a control system) is further provided, whereby the controller is configured to control the ion implantation system 100 and to communicate with and/or adjust the ion source 108, mass analyzer 128, moveable mass resolving aperture assembly 138, and deflecting deceleration element 160. Accordingly, the controller 170 is configured to selectively operate the ion implantation system 100 in both a drift mode and a decel mode, as discussed above. The controller 170 may be further configure to control the aperture the scanning system 130, parallelizer 132, and the dosimetry system 164. The controller 170 may comprise a computer, microprocessor, etc., and may be operable to take measurement values of beam characteristics and adjust parameters accordingly.

The controller 170, for example, can be coupled to various power supplies or other control equipment (not shown) associated with the terminal 102 from which the beam of ions is generated, as well as the mass analyzer 128 of the beamline assembly 104, the scanning element 146, the focusing and steering element 148, the parallelizer 132, and the deflecting deceleration element 160. Accordingly, any of these elements can be adjusted by the controller 170 to facilitate desired ion implantation. For example, the energy level of the ion beam 112, 135 may be adapted to adjust junction depths by adjusting the bias applied to electrodes in the ion extraction assembly 120 and the deflecting deceleration element 160.

The strength and orientation of magnetic field(s) generated in the mass analyzer 128, for example, can be adjusted, such as by regulating the amount of electrical current running through field windings therein to alter the charge to mass ratio of the ion beam 112, 135. The angle of implantation can be controlled by adjusting the strength or amplitude of the magnetic field(s) generated in the mass analyzer 128 in coordination with the moveable mass resolving aperture assembly 138. The controller 170 can further adjust the magnetic field(s) of the mass analyzer 128 and position 145 of the aperture plate 142 (e.g., by controlling the actuator 144) according to measurement data from, in this example, the one or more profilers 166. The controller 170, for example, can further verify the adjustments via additional measurement data and perform additional adjustments via the mass analyzer 128, the moveable mass resolving aperture assembly 138, and deflecting deceleration element 160, if necessary.

Figure 2:
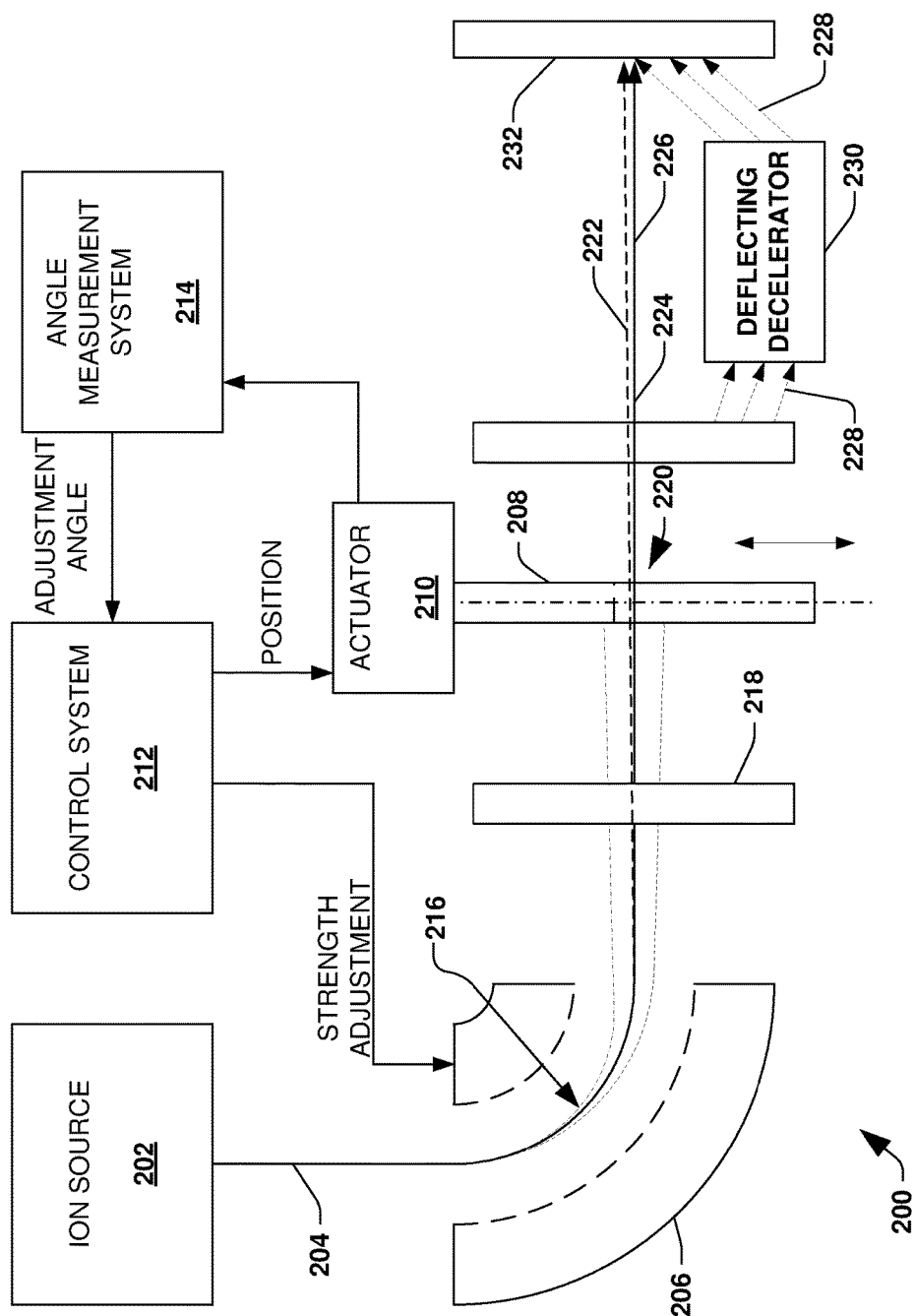
FIG. 2 is a diagram illustrating an ion implantation system employing a mass analyzer for mass analysis and angle correction in accordance with an aspect of the present invention.

FIG. 2 is a diagram illustrating a simplified ion implantation system 200 employing a mass analyzer for mass analysis and angle correction in accordance with an aspect of the present invention. The ion implantation system 200 is provided as an example and it is appreciated that other variations and configurations can be employed for alternate aspects of the invention.

The ion implantation system 200 includes an ion source 202 that generates an ion beam 204, a mass analyzer 206, a moveable mass resolving aperture assembly 208, an actuator 210, a controller 212 (e.g., a control system), and an angle measurement system 214. The ion source 202 can be an arc based source, RF based source, electron gun based source, and the like and generates the ion beam 204 along a beam path 216 having a selected dopant or species of ions for implanting. The ion source 202 provides the ion beam 204 with an initial energy and current.

The mass analyzer 206 is located downstream of the ion source 202 and performs mass analysis and an initial angle correction on the ion beam 204. The mass analyzer 206 generates a magnetic field that causes particles/ions having a selected charge-to-mass ratio to travel along a desired path. The magnetic field can also be adjusted to accommodate for angle corrections to alter the desired path to yield the angle corrections or adjustments.

A quadrupole lens or other focusing mechanism 218 can be positioned downstream of the mass analyzer 206 to compensate or mitigate the impact of beam blow up of the ion beam 204. For example, the focusing mechanism 218 can be positioned downstream of the mass analyzer 206 and upstream of the moveable mass resolving aperture assembly 208, causing the ion beam 204 to converge.

The moveable mass resolving aperture assembly 208 is positioned downstream of the mass analyzer 206. The moveable mass resolving aperture assembly 208, for example, includes a resolving aperture 220 through which the ion beam 204 passes through. The aperture 220 permits the selected dopants/species to pass through while preventing other particles from passing through. Additionally, the moveable mass resolving aperture assembly 208 can be moved along an axis transverse to the path 216 of the ion beam 204. This permits the moveable mass resolving aperture assembly 208 to be moved in response to changes in the desired path 216 of the ion beam 204 through the mass analyzer 206. The actuator 210 mechanically moves the moveable mass resolving aperture assembly 208 such that the resolving aperture 220 coincides with the path 216 of the ion beam 204 corresponding to angle adjustments performed by the mass analyzer 206. In other aspects of the disclosure, the actuator 210 can also select other resolving assemblies to accommodate other resolutions and/or other sized beams, as will be discussed infra.

According to one example, the resolving aperture 220 is sized to accommodate the beam envelope of the ion beam 204. However, in alternate aspects, the resolving aperture 220 can be sized to accommodate the beam envelopes across a range of possible beam paths 216.

The controller 212 is responsible for controlling and initiating angle adjustments during ion implantation as well as controlling mass analysis. The controller 212, for example, is coupled to the mass analyzer 206 and the actuator 210 and controls both components. The angle measurement system 214, for example, measures angle of incidence values of the ion beam 204 and determines needed adjustment angles. The angle measurement system 214, for example, can employ measurement cups (e.g., Faraday cups) or other suitable measurement device to obtain the measured angle of incidence values. Additionally, the angle measurement system 214 can derive or measure an average angle of incidence value for the ion beam 204. The angle measurement system 214, for example, then provides adjustment angles or correction values to the controller 212 based on the measured or derived angle of incidence values and a desired or selected angle of incidence value.

Initially, the controller 212 sets the magnetic field of the mass analyzer 206 at a nominal or base angle value, such as zero, and a selected charge-to-mass ratio. Additionally, the controller 212 sets the initial position of the resolving aperture 220 to coincide with a nominal path 222 associated with the base angle value. During implantation, a non-zero adjustment angle can be received from the angle measurement system 214. Based on the adjustment angle, the controller 212 adjusts the magnetic field of the mass analyzer 206 such that the selected species having the selected charge-to-mass ratio travels along an altered path 224 corresponding to the adjustment angle. Additionally, the controller 212 also adjusts the positioning of the resolving aperture 220 via the actuator 210 according to the altered path 224. Thereafter, the angle measurement system 214 can provide additional adjustment angles for further adjustment of the implant angle.

In accordance with one example of the present disclosure, such a control of the ion implantation system 200 is performed in the drift mode, the controller 212 is configured to control the beam path 216 so as to pass the ion beam 204 along a first path 226 through the resolving aperture 220 without deflecting or decelerating the mass analyzed beam via the deflecting deceleration element 230. However, in the decel mode, the controller 212 is configured to control the beam path 216 so as to pass the ion beam 204 along a second path 228 that passes through the resolving aperture and through the deflecting deceleration element 230 that deflects and decelerate the mass analyzed beam along the second path via the deflecting deceleration element. Accordingly, the second path 228 differs from the first path 226, whereby selectively varying the position of the resolving aperture 220 is further based on the selective variation of the beam path through the mass analyzer 206 and the deflecting deceleration element 230.

According to one example, the controller 212 is configured to vary the position of the resolving aperture 220 based on the selective deceleration of the mass analyzed beam in the decel mode. According to another example, the angle measurement system 214 is configured to determine a beam incidence angle proximate to a workpiece 232. The controller 212 is thus further configured to alter a magnetic field associated with the mass analyzer 206 based on the beam incidence angle, therein selectively varying the beam path. Accordingly, the resolving aperture 220, mass analyzer 206, and deflecting deceleration element 230 are operably coupled to one another via the controller 212, whereby the resolving aperture 220, mass analyzer 206, and deflecting deceleration element 230 may be configured to respond to a change in the desired path of the ion beam 204 through the mass analyzer 206. The angle measurement system 214 operates in conjunction with the resolving aperture 220, mass analyzer 206, and deflecting deceleration element 230 to vary the beam path for a desired beam incidence angle to optimally perform a selective ion implantation into the workpiece 232 in either the decel mode or drift mode.

Figure 3A:
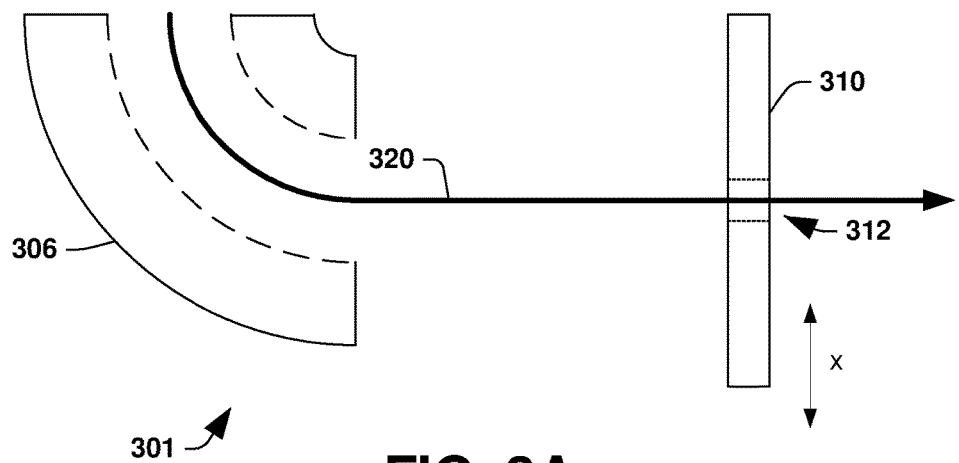
FIG. 3A is a view of a portion of an ion implantation system in accordance with an aspect of the present invention wherein an ion beam travels along a base or nominal path.
Figure 3B:
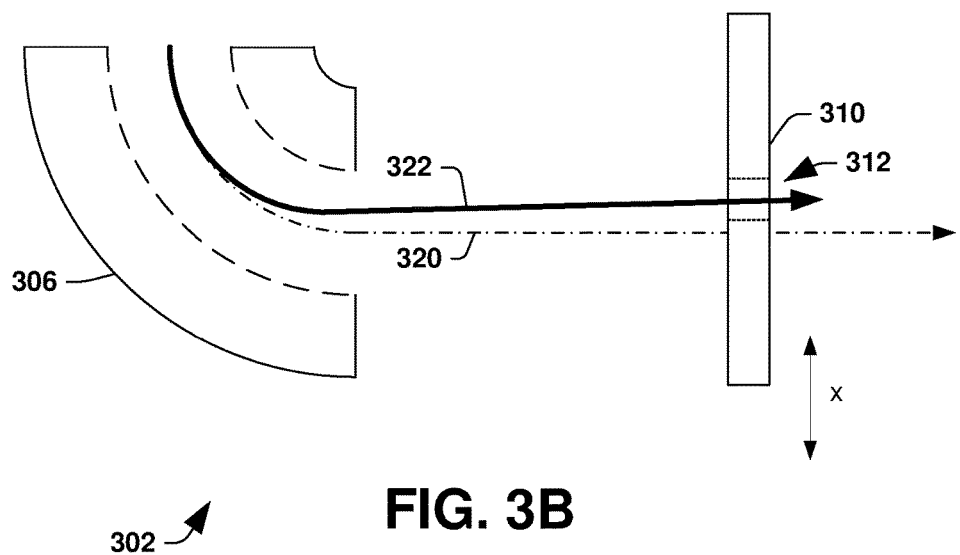
FIG. 3B is a view of a portion of an ion implantation system in accordance with an aspect of the present invention wherein an ion beam travels along an altered path.
Figure 3C:
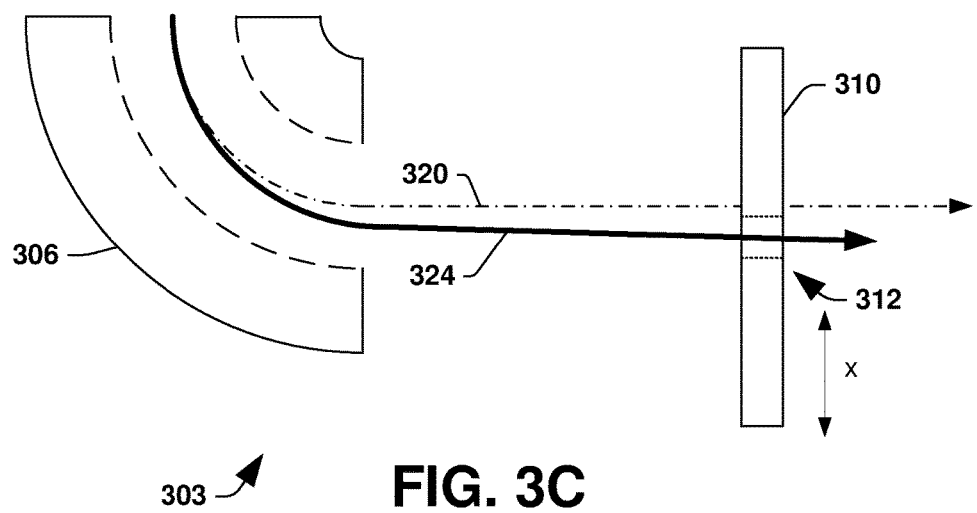
FIG. 3C is another view of a portion of an ion implantation system in accordance with an aspect of the present invention wherein an ion beam travels along an altered path.

FIGS. 3A to 3C are views of a portion of an ion implantation provided to illustrate altered beam paths and angle adjustments in accordance with an aspect of the present invention. The views are provided for illustrative purposes and as examples in order to facilitate understanding of the present invention.

FIG. 3A is a view 301 of a portion of an ion implantation system in accordance with an aspect of the present invention wherein an ion beam travels along a base or nominal path 320.

A mass analyzer 306 is located downstream of an ion source (not shown) and performs mass analysis and angle correction on an ion beam. The mass analyzer 306 generates a magnetic field that causes particles/ions having a selected charge-to-mass ratio to travel along a desired path. The magnetic field can also be adjusted to accommodate for angle corrections to alter the desired path to yield the angle corrections or adjustments. In this example, the ion beam travels along a base or nominal path 320 associated with the selected charge-to-mass ratio and a nominal or zero angle adjustment. A focusing mechanism (not shown) can be employed downstream of the mass analyzer 306 to compensate or mitigate the impact of beam blow up on the ion beam 304.

The moveable mass resolving aperture assembly 310 is positioned downstream of the lens 308. The moveable mass resolving aperture assembly 310 includes a resolving aperture 312 through which the ion beam 304 passes through. The aperture 312 permits the selected dopants/species to pass through while preventing other particles from passing through. Additionally, the moveable mass resolving aperture assembly 310 can be moved along an axis transverse to the path of the ion beam.

For the nominal path 320, the moveable mass resolving aperture assembly 310 is placed at a nominal position so that the ion beam can pass through the resolving aperture 312 while blocking other particles from passing through.

FIG. 3B is a view 302 of a portion of the ion implantation system in accordance with an aspect of the present invention wherein an ion beam travels along an altered path 322.

The mass analyzer 306 generates a varied field from that shown and described in FIG. 3A in order to alter the path of the ion beam. In one example, the mass analyzer 306 increases the magnitude of the magnetic field generated. As a result, the ion beam travels along the altered path 322 instead of the nominal path 320. The altered path 322 corresponds to a first angle adjustment or offset. The altered path 322 passes through the lens 308 and toward the moveable mass resolving aperture assembly 310. In view 302, for example, the moveable mass resolving aperture assembly 310 is moved in a positive direction such that the resolving aperture 312 permits passage of the ion beam there through along the altered path 322. Similarly, FIG. 3C is another view 303 of a portion of the ion implantation system in accordance with an aspect of the present invention wherein an ion beam travels along an altered path 324.

Again, the mass analyzer 306 generates a varied field from that shown and described FIG. 3A and FIG. 3B in order to alter the path of the ion beam. In one example, the mass analyzer 306 decreases the magnitude of the magnetic field generated. As a result, the ion beam travels along the altered path 324 instead of the nominal path 320. The altered path 324 corresponds to a second angle adjustment or offset. The altered path 324 passes through the lens 308 and toward the moveable mass resolving aperture assembly 310. The moveable mass resolving aperture assembly 310 is positioned in a negative direction, in this example, such that the resolving aperture 312 permits passage of the ion beam there through along the altered path 324 while blocking non selected species and unwanted particles.

As stated above, the moveable resolving aperture assembly comprises a resolving aperture through which an ion beam travels. The shape and size of the resolving aperture is generally dependent upon the mass resolution and a size and shape of a desired ion beam, also referred to as the beam envelope. A larger resolving aperture yields lower beam resolution in that more unwanted particles and ions can pass through such an aperture. Similarly, a smaller resolving aperture yields greater beam resolution in that less unwanted particles and ions can pass through such an aperture. However, the higher resolution can also prevent more of the selected or desired species from passing through the resolving aperture, thereby causing undesired beam current loss. Thus, resolving apertures are typically sized according to a desired mass resolution and beam envelope.

Additionally, the resolving aperture of the present invention can also be designed to accommodate varied beam paths corresponding to a range of possible angle adjustments. The above FIGS. 3A to 3C depict some examples of some possible varied paths. The resolving aperture can be appropriately sized to accommodate such varied beam paths.

Figure 4:
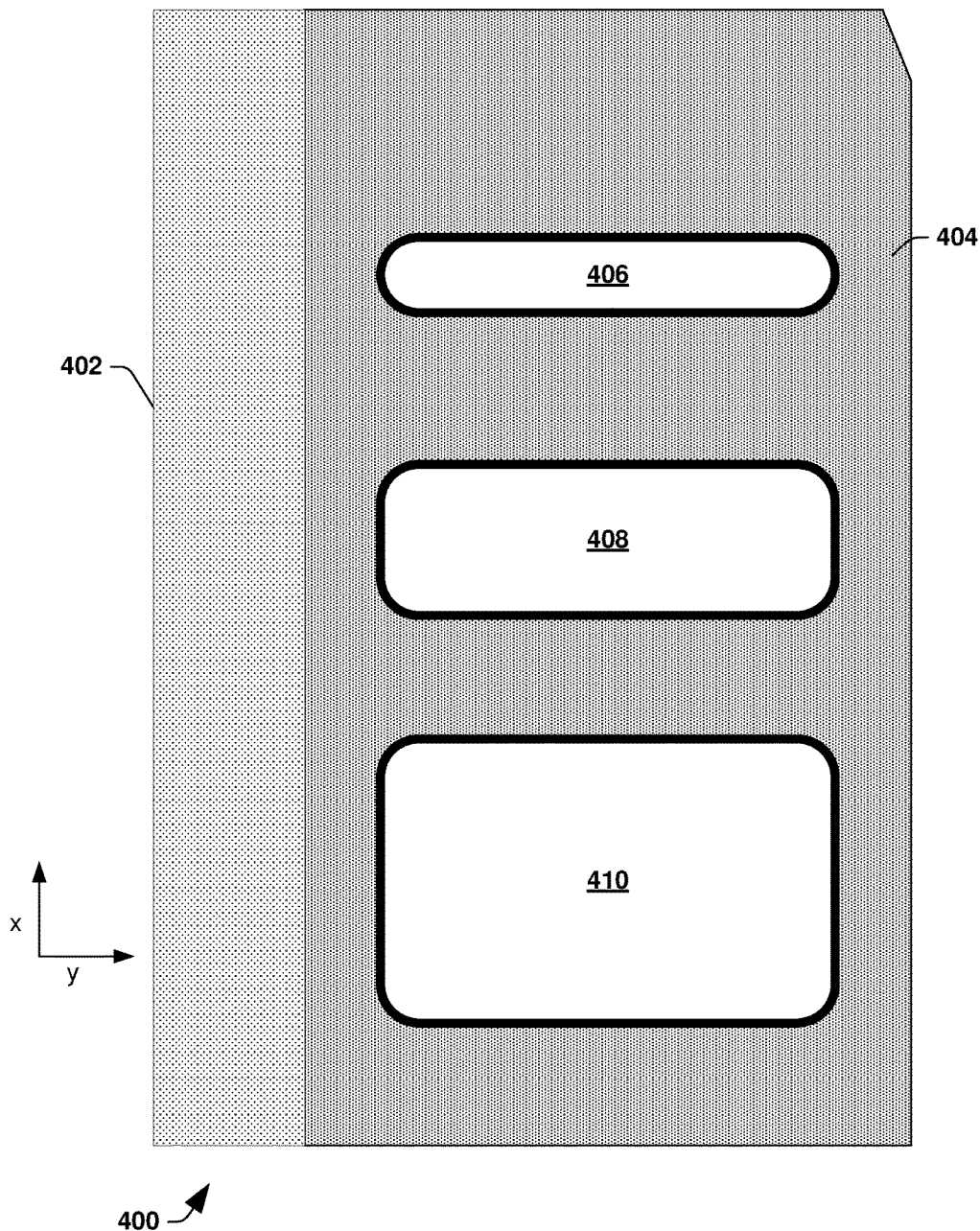
FIG. 4 is a side view of a moveable mass resolving aperture assembly in accordance with an aspect of the present invention.

FIG. 4 is a side view of a moveable mass resolving aperture assembly 400 in accordance with an aspect of the present invention. The view is provided as an example and is not intended to limit the invention. The assembly 400, in this example, can accommodate removable plates that allow changing the resolving aperture employed. Additionally, the assembly 400, in this example, can operate with varied shaped beams and/or varied mass resolutions. Thus differently sized beams can be employed within such systems and different plates can be employed to accommodate the varied beam envelopes. Additionally, different plates can be employed to accommodate for varied resolutions and ranges of angle adjustments.

In FIG. 4, the assembly 400 comprises an arm 402 that holds a resolving plate 404. The resolving plate 404 includes a plurality of resolving apertures 406, 408, 410 having selected sizes and shapes, which can correspond to selected beam envelopes, selected resolutions, and/or ranges of angle adjustments.

The first aperture 406 has a selected size and shape that corresponds to a beam envelope, selected resolution, and/or range of angle adjustments. In this example, the size of the first aperture 406 in the y-direction (e.g., height) is sufficiently large to not occlude the passage of the ion beam in the y-direction, whereas in the x direction, the size of the first aperture (e.g., width) is relatively small. Thus, for example, the first aperture 406 could accommodate an ion beam whose size in the x-direction, or width, is relatively small.

The second aperture 408 has a second selected size and a second shape that corresponds to a second beam envelope, a second selected resolution, and/or a second range of angle adjustments. As an example, the second aperture 408 could accommodate a medium width ion beam.

The third aperture 410 has a third selected size and a third shape that corresponds to a third beam envelope, a third selected resolution, and/or a third range of angle adjustments. As an example, the third aperture could accommodate a relatively wide ion beam.

It is noted that the y direction for the apertures 406, 408, 410 is depicted as similar for illustrative purposes, however aspects of the invention can also include variations in the y direction. Additionally, aspects of the invention can include more or less apertures on a single plate.

During operation, the assembly 400 is positioned such that one of the apertures is positioned along a path of an ion beam to remove contaminants or unselected material from the ion beam. The selected aperture corresponds to a selected beam envelope and/or selected mass resolution. It is appreciated that materials or portions of the beam may pass through one of the non selected apertures, but those portions are not generally propagated to a target workpiece, and can advantageously be blocked by additional aperture. For example, while not shown, such an additional aperture can be centered on the desired beam path, while blocking any other beams.

Figure 5:
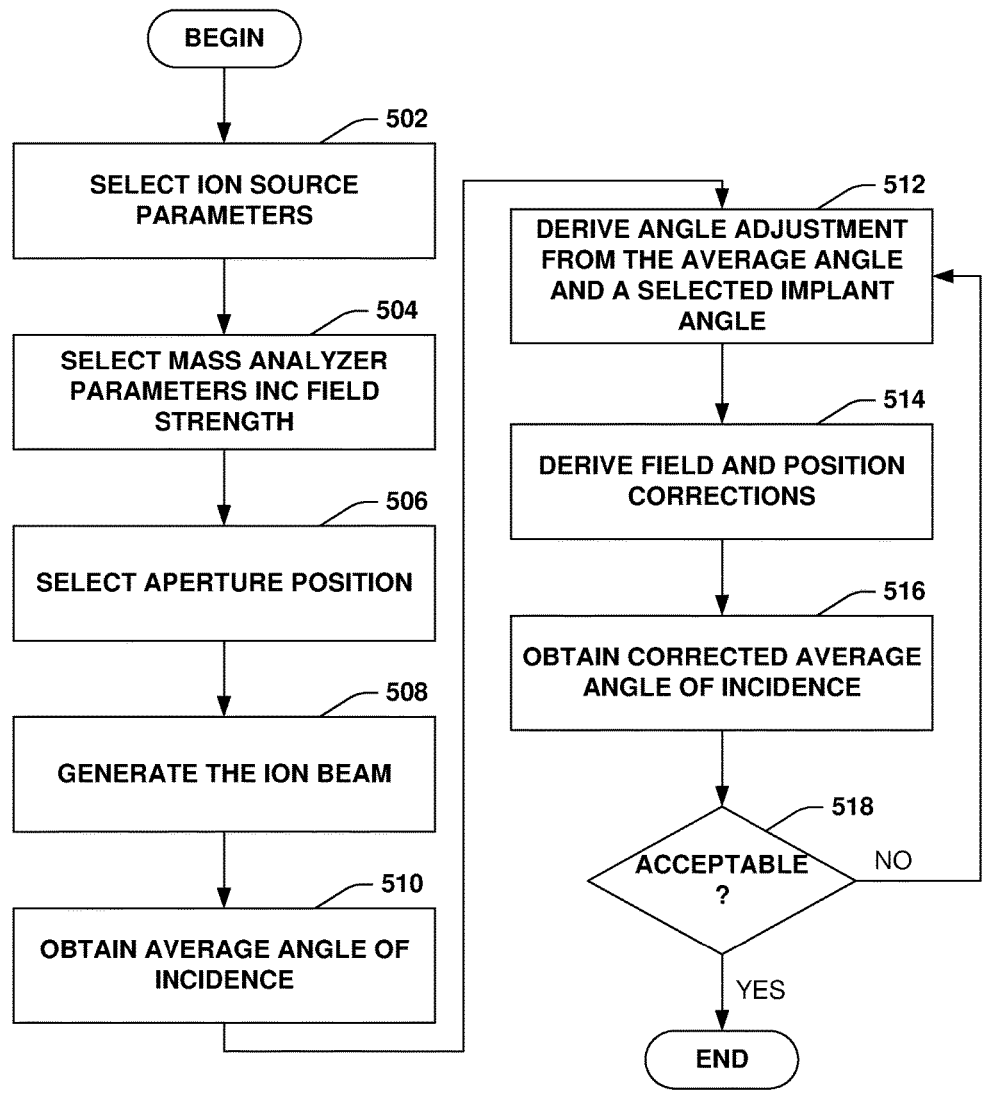
FIG. 5 is a flow diagram of a method of adjusting the angle of implantation in accordance with an aspect of the present invention.

FIG. 5 is a flow diagram of a method 500 of adjusting the angle of implantation in accordance with an aspect of the present invention. The method 500 can facilitate uniform angular distribution of ion flux across the surface of a workpiece during ion implantation by correcting or adjusting the angle of implant. It is appreciated that the above figures and descriptions can also be referenced for the method 500.

The method 500 begins at block 502 wherein parameters of an ion source are selected according to a desired specie, energy, current, and the like. The ion source can be an arc based or non arc based ion source, such as an RF or electron gun base ion source. The specie or species can be selected by selecting one or more source materials for the ion source. The current can be selected by modulating power values and/or electrodes.

Parameters of a mass analyzer are selected at block 504 according to a charge-to-mass ratio corresponding to the selected species and a base or nominal angle. The parameters, such as current applied to coil windings, are set to yield a magnetic field that causes the selected specie to travel along a nominal or base path corresponding to the nominal angle and pass through the mass analyzer.

An initial positioning of a resolving aperture is also selected at block 506. The initial positioning corresponds to the base path and permits passage there through according to a selected mass resolution.

An ion beam is generated as ion implantation is initiated at block 508. An average angle of incidence for the ion beam is obtained at block 510. The average angle of incidence can be measured in one example. In another example, multiple beam angle measurements are obtained and an average value is derived there from. It is noted that other beam measurements and angle values can also be employed. For example, calculations of the average angle through an optical train of an ion implanter can be employed taking into account the effects of acceleration and/or deceleration whenever applicable.

An angle adjustment is derived from a selected angle of implant and the average angle obtained at block 512. For example, if the selected angle is equal to the average angle, the angle adjustment is zero. A magnetic field correction and aperture position correction are determined and applied at block 514 according to the angle adjustment. The magnetic field correction adjusts the path of the ion beam to correct the angle of the ion beam. The aperture position correction moves the resolving aperture so that the selected species can pass there through.

It is noted that the angle adjustment and/or magnetic field correction can be limited so as to prevent over adjustment. Also, errors in the angle adjustment can be reduced by employing iterative correction algorithms. In such instances, suitable angle correction can take a number of passes.

A corrected average angle of implant is obtained at block 516 after applying the field and position corrections. The corrected average angle of implant is obtained as in block 510. If the second average angle is not sufficiently close to the selected angle of implant or within an acceptable tolerance, as determined at block 518, the method returns to block 510 and continues iteratively until the average angle of the ion beam is within the acceptable tolerance of the selected angle.

It is appreciated that the method 500 is described in the above order in order to facilitate an understanding of the present invention. It is noted that the method 500 can be performed with other suitable orderings in accordance with the present invention. Additionally, some blocks can be omitted and other additional functions performed in other aspects of the invention.

Figure 6:
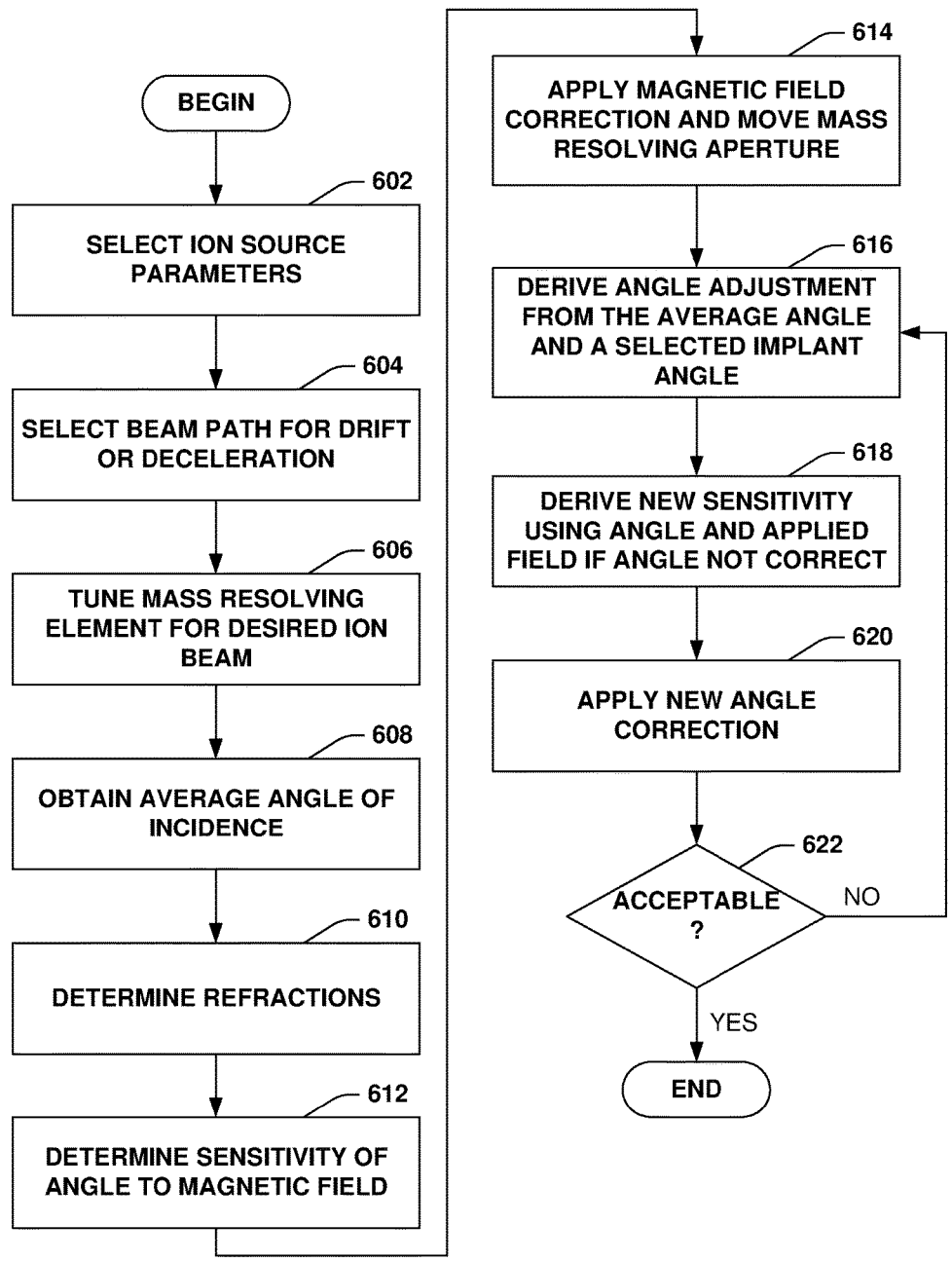
FIG. 6 is a flow diagram of another method of adjusting the angle of implantation in accordance with an aspect of the present invention.

FIG. 6 illustrates a method 600 for correcting an implantation angle in an ion implantation system, such as any of the ion implantation systems discussed above. In block 602, the ion source is tuned for one or more of a desired species, energy and current. In block 604, the beam path is selected as being in either a drift mode or deceleration (decel) mode of operation. In block 606, the moveable mass resolving aperture assembly is tuned to achieve a desired mass resolution and desired ion beam at the workpiece location.

In act 608, the angle of the ion beam is measured, and an average angle is calculated. In act 610, a determination is made as to whether the average angle is deemed to satisfy predetermined criteria. For example, refractions of the average angle through the ion implantation system may be calculated if any acceleration and/or deceleration is being performed.

In act 612, the refraction index and sensitivity of the angle to magnetic field is used to calculate a magnetic field correction in order to modify the position of the moveable mass resolving aperture to a new focal point. In act 614, the magnetic field correction is applied, whereby the moveable mass resolving aperture is moved to the new position at the focal point.

In act 616, the angle distribution of the ion beam is measured in order to verify that the average angle is corrected. If the average angle is not properly corrected, a new sensitivity is computed using the angle data and applied magnetic field correction in act 618, whereby in act 620, the new correction is applied. In act 622, a determination is made as to whether the desired implant angle is attained, and the process reverts back to act 616 if the desired implant is angle is not attained. If the desired implant angle is determined to be attained in act 622, implantation into workpieces may begin at the desired implant angle.

Accordingly, the present disclosure thus contemplates that during ion implantation, uniform angular distribution of ion flux across the surface of the semiconductor workpiece can be an important consideration. The angular content of the ion beam, for example, defines implant properties thru crystal channeling effects or shadowing effects under vertical structures, such as photoresist masks or CMOS transistor gates. Uncontrolled angular content of the ion beam leads to uncontrolled, and often undesired implant properties.

The angle content of the ion beam is therefore measured to high accuracy using a variety of beam diagnostic equipment, some of which has have been discussed above. The measurement data may then be used in an angle correction method. Once the correction is applied, the measurement of beam angles and its adjustment are repeated until the desired beam angle distribution is achieved.

Another consideration in ion implantation is energy purity. For example, in ion implantation systems having deceleration, it is advantageous to deflect the ion beam from a path where higher energy ions travel to a new path after deceleration, such that neutrals that are not decelerated do not reach the workpiece. This deflection, for example, entails a beam path change as well as an angle change, which may need subsequent correction. The present disclosure thus provides a novel system and method for providing beam path changes and controlling ion beam angles in ion implantation systems that utilize beam deflection for energy purity.

During drift operation of the ion implantation system, for example, the beam path is determined by the focal point of the mass analyzer (a mass resolving dipole) and the implant position on the workpiece. The mass resolving aperture, for example, is positioned at the focal point of the mass analyzer, whereby only beams passing thru the mass resolving aperture reach the workpiece. In decel operation of the ion implantation system, a beam path change is accomplished by steering the ion beam with the magnets of the mass analyzer such that the mass resolving focal point is translated laterally from the drift focal point. An actuator moves the mass resolving aperture to the new focal point, whereby beamlets that pass thru the displaced mass resolving aperture enter a deflecting deceleration stage, whereby ions are redirected toward the workpiece.

The present disclosure contemplates that the deflection angle of the deceleration stage generally defines the energy purity of the ion beam that reaches the workpiece. Angle correction may be preferably performed by controlling the angle of the mass-resolved pencil beam by controlling the amplitude of the mass resolving magnetic dipole field at the mass analyzer. In some applications, for example, this type of angle correction can be sufficient. However, in other applications it may be desirable to measure and control the angle correction and adjust the position of the mass resolving aperture during and/or after correction.

The present disclosure contemplates further contemplates that mass resolution requirements can vary for different ion beams. As such, the moveable mass resolving aperture assembly and systems of the present disclosure may be configured to serve multiple purposes, such as selecting a desired mass resolving aperture having a relatively small opening for relatively high resolution implants, or for selecting a larger opening for lower resolution implants.

Figure 7:
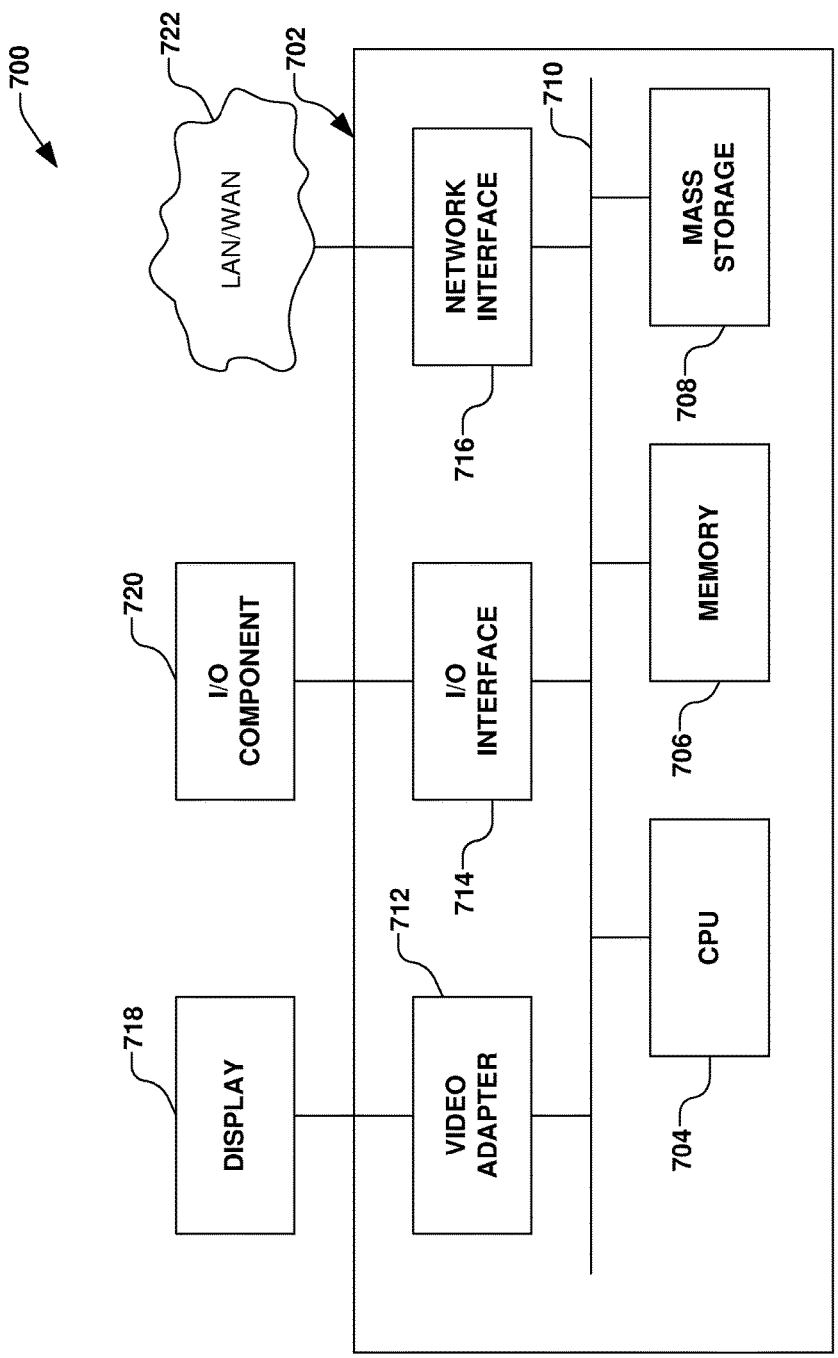
FIG. 7 illustrates a schematic representation of an exemplary processor-based system for controlling an ion implantation system.

In accordance with another aspect, the aforementioned methodology may be implemented using computer program code in one or more general purpose computer or processor based system. As illustrated in FIG. 7, a block diagram is provided of a processor based system 700 is provided in accordance with another embodiment. For example, the controller 170 of FIG. 1 or the controller 212 of FIG. 2 may comprise the processor based system 700 of FIG. 7. The processor based system 700, for example, is a general purpose computer platform and may be used to implement processes discussed herein. The processor based system 700 may comprise a processing unit 702, such as a desktop computer, a workstation, a laptop computer, or a dedicated unit customized for a particular application. The processor based system 700 may be equipped with a display 718 and one or more input/output (I/O) devices 720, such as a mouse, a keyboard, or printer. The processing unit 702 may include a central processing unit (CPU) 704, memory 706, a mass storage device 708, a video adapter 712, and an I/O interface 714 connected to a bus 710.

The bus 710 may be one or more of any type of several bus architectures including a memory bus or memory controller, a peripheral bus, or video bus. The CPU 704 may comprise any type of electronic data processor, and the memory 706 may comprise any type of system memory, such as static random access memory (SRAM), dynamic random access memory (DRAM), or read-only memory (ROM).

The mass storage device 708 may comprise any type of storage device configured to store data, programs, and other information and to make the data, programs, and other information accessible via the bus 710. The mass storage device 708 may comprise, for example, one or more of a hard disk drive, a magnetic disk drive, or an optical disk drive. The mass storage device 708 may comprise a non-transitory computer readable medium)

The video adapter 712 and the I/O interface 714 provide interfaces to couple external input and output devices to the processing unit 702. Examples of input and output devices include the display 718 coupled to the video adapter 712 and the I/O device 720, such as a mouse, keyboard, printer, and the like, coupled to the I/O interface 714. Other devices may be coupled to the processing unit 702, and additional or fewer interface cards may be utilized. For example, a serial interface card (not shown) may be used to provide a serial interface for a printer. The processing unit 702 also may include a network interface 716 that may be a wired link to a local area network (LAN) or a wide area network (WAN) 722 and/or a wireless link.

It should be noted that the processor based system 700 may include other components or exclude some components described herein. For example, the processor based system 700 may include power supplies, cables, a motherboard, removable storage media, cases, and the like. These other components, although not shown, are considered part of the processor based system 700.

Embodiments of the present disclosure may be implemented on the processor based system 700, such as by program code executed by the CPU 704. Various methods according to the above-described examples and embodiments may be implemented by program code. Accordingly, explicit discussion herein is omitted.

Further, it should be noted that any control modules and/or control of the system 100 in FIG. 1 may all be implemented on one or more processor based systems 700 of FIG. 7. Communication between the different modules and devices may vary depending upon how the modules are implemented. If the modules are implemented on one processor based system 700, data may be saved in memory 706 or mass storage 708 between the execution of program code for different steps by the CPU 704. The data may then be provided by the CPU 704 accessing the memory 706 or mass storage 708 via bus 710 during the execution of a respective step. If modules are implemented on different processor based systems 700 or if data is to be provided from another storage system, such as a separate database, data can be provided between the systems 700 through I/O interface 714 or network interface 716. Similarly, data provided by the devices or stages may be input into one or more processor based system 700 by the I/O interface 714 or network interface 716. A person having ordinary skill in the art will readily understand other variations and modifications in implementing systems and methods that are contemplated within the scope of varying embodiments.

Although the invention has been illustrated and described with respect to one or more implementations, alterations and/or modifications may be made to the illustrated examples without departing from the spirit and scope of the appended claims. In particular regard to the various functions performed by the above described components or structures (blocks, units, engines, assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. The term "exemplary" as used herein is intended to imply an example, as opposed to best or superior. Furthermore, to the extent that the terms "including", "includes", "having", "has", "with", or variants thereof are used in either the detailed description and the claims, such terms are intended to be inclusive in a manner similar to the term "comprising".

What is claimed is:

1. An ion implantation system comprising:
    an ion source configured to form an ion beam;
    a mass analyzer configured to selectively separate ions having a predetermined charge-to-mass ratio from the ion beam, therein defining a mass analyzed beam along a beam path, wherein the mass analyzer is configured to selectively vary the beam path;
    a moveable mass resolving aperture assembly having a resolving aperture configured to permit selected species of the mass analyzed beam therethrough, and wherein the moveable mass resolving aperture assembly is configured to selectively vary a position of the resolving aperture in response to the selective variation of the beam path by the mass analyzer;
    a deflecting deceleration element positioned downstream of the moveable mass resolving aperture assembly and configured to selectively vary the beam path therethrough, wherein the deflecting deceleration element is further configured to selectively decelerate the mass analyzed beam; and
    a controller configured to control the ion source, mass analyzer, moveable mass resolving aperture assembly, and deflecting deceleration element to selectively operate the ion implantation system in a drift mode and a decel mode, wherein in the drift mode, the controller is configured to control the beam path so as to pass the mass analyzed beam along a first path through the resolving aperture without deflecting or decelerating the mass analyzed beam via the deflecting deceleration element, and wherein in the decel mode, the controller is configured to control the beam path so as to pass the mass analyzed beam along a second path passing through the resolving aperture and to selectively deflect and decelerate the mass analyzed beam along the second path via the deflecting deceleration element, wherein the second path differs from the first path, and wherein selectively varying the position of the resolving aperture is based on the selective variation of the beam path through the mass analyzer and the deflecting deceleration element.

2. The ion implantation system of claim 1, wherein the moveable mass resolving aperture assembly comprises a resolving plate operable coupled to an actuator, wherein the resolving aperture is defined in the resolving plate, and wherein the controller is configured to selectively vary the position of the resolving plate via a control of the actuator.

3. The ion implantation system of claim 2, wherein the controller is further configured to vary a position of the resolving aperture proximate to an exit of the mass analyzer based on one or more of a selected beam envelope and a selected mass resolution of the ion beam.

4. The ion implantation system of claim 3, wherein the controller is further configured to vary a position of the resolving aperture based on the selective deceleration of the mass analyzed beam in the decel mode.

5. The ion implantation system of claim 3, wherein the resolving plate comprises a plurality of apertures having a plurality of respective sizes and shapes defined therein, wherein the controller is further configured to vary a position of the plurality of resolving apertures proximate to the exit of the mass analyzer based on the one or more of the selected beam envelope and selected mass resolution of the ion beam.

6. The ion implantation system of claim 1, further comprising an angle measurement system configured to determine a beam incidence angle proximate to a workpiece, wherein the controller is further configured to alter a magnetic field associated with the mass analyzer based on the beam incidence angle, therein selectively varying the beam path.

7. The ion implantation system of claim 6, wherein the controller is further configured to vary the position of the resolving aperture based on the beam incidence angle, therein selectively varying the beam path.

8. The ion implantation system of claim 6, wherein the angle measurement system comprises a measurement cup configured to translate through the beam path and measure a plurality of beam incidence angles at a plurality of locations.

9. The ion implantation system of claim 1, further comprising:
    a scanner positioned downstream of the moveable mass resolving aperture assembly, wherein the scanner is configured to generate a time varying oscillatory magnetic field across a portion of the beam path; and
    a parallelizer positioned downstream of the scanner, wherein the parallelizer is configured to redirect the mass analyzed beam parallel to a common axis.

10. An ion implantation system comprising:
    an ion source having an extraction aperture through which an ion beam is extracted;
    a mass analyzer configured to mass analyze the ion beam and selectively output a mass analyzed beam having a beam path, wherein the mass analyzer is configured to selectively vary the beam path;

a moveable mass resolving aperture assembly having a resolving aperture, wherein the moveable mass resolving aperture assembly is configured to permit selected species of the mass analyzed beam through the resolving aperture, and wherein moveable mass resolving aperture assembly is configured to selectively vary a position of the resolving aperture in response to the selective variation of the beam path by the mass analyzer;

a deflecting deceleration element configured to selectively vary the beam path downstream of the moveable mass resolving aperture assembly, wherein the deflecting deceleration element is further configured to selectively decelerate the mass analyzed beam;

an endstation configured to support a workpiece that is to be implanted with ions from the mass analyzed beam; and a controller configured to control the ion source, mass analyzer, moveable mass resolving aperture assembly, and deflecting deceleration element to selectively operate the ion implantation system in a drift mode and a decel mode, wherein in the drift mode, the controller is configured to control the beam path so as to pass the mass analyzed beam along a first path through the resolving aperture without deflecting or decelerating the mass analyzed beam via the deflecting deceleration element, and wherein in the decel mode, the controller is configured to control the beam path so as to pass the mass analyzed beam along a second path passing through the resolving aperture and to selectively deflect and decelerate the mass analyzed beam along the second path via the deflecting deceleration element, wherein the second path differs from the first path, wherein selectively varying the position of the resolving aperture is based on the selective variation of the beam path through the mass analyzer and deflecting deceleration element.

11. The ion implantation system of claim 10, wherein the first path intersects the workpiece at a nominal angle of incidence and the second path intersects the workpiece at an adjusted angle of incidence, wherein the adjusted angle of incidence differs from the nominal angle of incidence.

12. The ion implantation system of claim 10, wherein the moveable mass resolving aperture assembly comprises a resolving plate operable coupled to an actuator, wherein the resolving aperture is defined in the resolving plate, and wherein the controller is configured to selectively vary the position of the resolving plate via a control of the actuator.

13. The ion implantation system of claim 12, wherein the controller is further configured to vary a position of the resolving aperture proximate to an exit of the mass analyzer based on one or more of a selected beam envelope and a selected mass resolution of the ion beam.

14. The ion implantation system of claim 13, wherein the controller is further configured to vary a position of the resolving aperture based on the selective deceleration of the mass analyzed beam in the decel mode.

15. The ion implantation system of claim 13, wherein the resolving plate comprises a plurality of apertures having a plurality of respective sizes and shapes defined therein, wherein the controller is further configured to vary a position of the plurality of resolving apertures proximate to the exit of the mass analyzer based on the one or more of the selected beam envelope and selected mass resolution of the ion beam.

16. The ion implantation system of claim 10, further comprising a focusing component positioned downstream of the mass analyzer and upstream of the moveable mass resolving aperture assembly, wherein the focusing component is configured to converge the mass analyzed beam.

17. The ion implantation system of claim 10, further comprising an angle measurement system configured to determine a beam incidence angle proximate to the workpiece, wherein the controller is further configured to alter a magnetic field associated with the mass analyzer based on the beam incidence angle, therein selectively varying the beam path.

18. The ion implantation system of claim 17, wherein the controller is further configured to vary the position of the resolving aperture based on the beam incidence angle, therein selectively varying the beam path.

19. The ion implantation system of claim 17, wherein the angle measurement system comprises a measurement cup configured to translate through the beam path and measure a plurality of beam incidence angles at a plurality of locations.

20. The ion implantation system of claim 10, further comprising:
a scanner positioned downstream of the moveable mass resolving aperture assembly, wherein the scanner is configured to generate a time varying oscillatory magnetic field across a portion of the beam path; and
a parallelizer positioned downstream of the scanner, wherein the parallelizer is configured to redirect the mass analyzed beam parallel to a common axis.

* * * * *